(12) United States Patent
GanapathiSubramanian et al.

(10) Patent No.: US 7,803,308 B2
(45) Date of Patent: Sep. 28, 2010

(54) TECHNIQUE FOR SEPARATING A MOLD FROM SOLIDIFIED IMPRINTING MATERIAL

(75) Inventors: Mahadevan GanapathiSubramanian, Cedar Park, TX (US); Byung-Jin Choi, Austin, TX (US); Michael N. Miller, Austin, TX (US); Nicholas A. Stacey, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 619 days.

(21) Appl. No.: 11/292,568

(22) Filed: Dec. 1, 2005

(65) Prior Publication Data
US 2007/0126156 A1    Jun. 7, 2007

(51) Int. Cl.
B28B 7/10    (2006.01)
(52) U.S. Cl. .................. 264/334; 264/220; 264/224; 425/440; 425/43.6; 425/437
(58) Field of Classification Search .......... 264/334, 264/224, 220; 378/34; 977/887; 349/4; 425/440, 436, 43.6, 437
See application file for complete search history.

(56) References Cited
U.S. PATENT DOCUMENTS

| | | | |
|---|---|---|---|
| 1,236,304 A | 9/1917 | Howell | |
| 2,124,711 A | * 7/1938 | Rowell | ............ 101/41 |
| 2,201,302 A | 5/1940 | Rowe | |
| 3,503,538 A | 3/1970 | Barnes | |
| 3,868,901 A | 3/1975 | Valiela | |
| 4,022,855 A | 5/1977 | Hamblen | |
| 4,070,116 A | 1/1978 | Frosch et al. | |
| 4,208,240 A | 6/1980 | Latos | |
| 4,364,971 A | 12/1982 | Sack et al. | |
| 4,440,804 A | 4/1984 | Milgram | |
| 4,512,848 A | 4/1985 | Deckman et al. | |
| 4,521,445 A | 6/1985 | Nablo et al. | |
| 4,552,832 A | 11/1985 | Blume et al. | |
| 4,576,900 A | 3/1986 | Chiang | |
| 4,637,904 A | 1/1987 | Rounds | |

(Continued)

FOREIGN PATENT DOCUMENTS

EP    0 795 016 A1    9/1997

(Continued)

OTHER PUBLICATIONS

Feynman, There's Plenty of Room at the Bottom, Dec. 1, 1959.

(Continued)

*Primary Examiner*—Khanh Nguyen
*Assistant Examiner*—Saeed M Huda
(74) *Attorney, Agent, or Firm*—Laura C. Robinson

(57) ABSTRACT

The present invention provides a method for separating a mold from solidified imprinting material that includes creating deformation in the template in which the mold is included. The deformation is sufficient to create a returning force that is greater than an adhesion forced between the solidified imprinting material and the mold. For example, the deformation may result from a pressure differential created between the mold and a side of the template disposed opposite to the mold. In this manner, the distortion may be undulations in the template of sufficient magnitude to contact a substrate upon which the solidified imprinting material is disposed.

22 Claims, 10 Drawing Sheets

U.S. PATENT DOCUMENTS

| | | | |
|---|---|---|---|
| 4,676,868 A | 6/1987 | Riley et al. |
| 4,707,218 A | 11/1987 | Giammarco et al. |
| 4,731,155 A | 3/1988 | Napoli et al. |
| 4,737,425 A | 4/1988 | Lin et al. |
| 4,846,931 A | 7/1989 | Gmitter et al. |
| 4,848,911 A | 7/1989 | Uchida et al. |
| 4,857,477 A | 8/1989 | Kanamori |
| 4,862,019 A | 8/1989 | Ashmore, Jr. |
| 4,866,307 A | 9/1989 | Ashmore, Jr. |
| 4,883,561 A | 11/1989 | Gmitter et al. |
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,932,358 A | 6/1990 | Studley et al. |
| 4,936,465 A | 6/1990 | Zold |
| 4,957,663 A | 9/1990 | Zwiers et al. |
| 4,959,252 A | 9/1990 | Bonnebat et al. |
| 4,964,945 A | 10/1990 | Calhoun |
| 4,980,316 A | 12/1990 | Huebner |
| 5,003,062 A | 3/1991 | Yen |
| 5,028,361 A | 7/1991 | Fujimoto |
| 5,028,366 A | 7/1991 | Harakal et al. |
| 5,053,318 A | 10/1991 | Gulla et al. |
| 5,073,230 A | 12/1991 | Maracas et al. |
| 5,110,514 A | 5/1992 | Soane |
| 5,124,089 A | 6/1992 | Ohkoshi et al. |
| 5,126,006 A | 6/1992 | Cronin et al. |
| 5,148,037 A | 9/1992 | Suda et al. |
| 5,151,754 A | 9/1992 | Ishibashi et al. |
| 5,212,147 A | 5/1993 | Sheats |
| 5,232,874 A | 8/1993 | Rhodes et al. |
| 5,240,550 A | 8/1993 | Boehnke et al. |
| 5,240,878 A | 8/1993 | Fitzsimmons et al. |
| 5,244,818 A | 9/1993 | Jokerst et al. |
| 5,246,880 A | 9/1993 | Reele et al. |
| 5,250,472 A | 10/1993 | Chen et al. |
| 5,259,926 A | 11/1993 | Kuwabara et al. |
| 5,277,749 A | 1/1994 | Griffith et al. |
| 5,288,436 A | 2/1994 | Liu et al. |
| 5,324,683 A | 6/1994 | Fitch et al. |
| 5,328,810 A | 7/1994 | Lowrey et al. |
| 5,330,881 A | 7/1994 | Sidman et al. |
| 5,357,122 A | 10/1994 | Okubora et al. |
| 5,362,606 A | 11/1994 | Hartney et al. |
| 5,362,940 A | 11/1994 | MacDonald et al. |
| 5,364,222 A | 11/1994 | Akimoto et al. |
| 5,366,851 A | 11/1994 | Novembre |
| 5,371,822 A | 12/1994 | Horwitz et al. |
| 5,374,327 A | 12/1994 | Imahashi et al. |
| 5,376,810 A | 12/1994 | Hoenk et al. |
| 5,422,295 A | 6/1995 | Choi et al. |
| 5,424,549 A | 6/1995 | Feldman |
| 5,425,848 A | 6/1995 | Haisma et al. |
| 5,431,777 A | 7/1995 | Austin et al. |
| 5,434,107 A | 7/1995 | Paranjpe |
| 5,445,195 A | 8/1995 | Kim |
| 5,449,117 A | 9/1995 | Muderlak et al. |
| 5,451,435 A | 9/1995 | Yu |
| 5,453,157 A | 9/1995 | Jeng |
| 5,458,520 A | 10/1995 | DeMercurio et al. |
| 5,468,542 A | 11/1995 | Crouch |
| 5,480,047 A | 1/1996 | Tanigawa et al. |
| 5,512,131 A | 4/1996 | Kumar et al. |
| 5,542,605 A | 8/1996 | Campau |
| 5,545,367 A | 8/1996 | Bae et al. |
| 5,601,641 A | 2/1997 | Stephens |
| 5,612,068 A | 3/1997 | Kempf et al. |
| 5,628,917 A | 5/1997 | MacDonald et al. |
| 5,643,364 A | 7/1997 | Zhao et al. |
| 5,654,238 A | 8/1997 | Cronin et al. |
| 5,669,303 A | 9/1997 | Maracas et al. |
| 5,736,424 A | 4/1998 | Prybyla et al. |
| 5,753,014 A | 5/1998 | Van Rijn |
| 5,772,905 A | 6/1998 | Chou |
| 5,776,748 A | 7/1998 | Singhvi et al. |
| 5,779,799 A | 7/1998 | Davis |
| 5,804,474 A | 9/1998 | Sakaki et al. |
| 5,812,629 A | 9/1998 | Clauser |
| 5,817,579 A | 10/1998 | Ko et al. |
| 5,820,769 A | 10/1998 | Chou |
| 5,843,363 A | 12/1998 | Mitwalsky et al. |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,926,690 A | 7/1999 | Toprac et al. |
| 5,948,470 A | 9/1999 | Harrison et al. |
| 5,948,570 A | 9/1999 | Kornblit et al. |
| 5,956,216 A | 9/1999 | Chou |
| 5,974,150 A | 10/1999 | Kaish et al. |
| 5,983,906 A | 11/1999 | Zhao et al. |
| 6,046,056 A | 4/2000 | Parce et al. |
| 6,048,799 A | 4/2000 | Prybyla |
| 6,067,144 A | 5/2000 | Murouchi |
| 6,074,827 A | 6/2000 | Nelson et al. |
| 6,150,680 A | 11/2000 | Eastman et al. |
| 6,180,239 B1 | 1/2001 | Whitesides et al. |
| 6,218,316 B1 | 4/2001 | Marsh |
| 6,242,363 B1 | 6/2001 | Zhang |
| 6,245,213 B1 | 6/2001 | Olsson et al. |
| 6,274,294 B1 | 8/2001 | Hines |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,348,999 B1 | 2/2002 | Summersgill et al. |
| 6,355,198 B1 | 3/2002 | Kim et al. |
| 6,376,379 B1 | 4/2002 | Quek et al. |
| 6,383,928 B1 | 5/2002 | Eissa |
| 6,387,330 B1 | 5/2002 | Bova et al. |
| 6,387,783 B1 | 5/2002 | Furukawa et al. |
| 6,388,253 B1 | 5/2002 | Su |
| 6,391,217 B2 | 5/2002 | Schaffer et al. |
| 6,391,798 B1 | 5/2002 | DeFelice et al. |
| 6,423,207 B1 | 7/2002 | Heidari et al. |
| 6,482,742 B1 | 11/2002 | Chou |
| 6,495,907 B1 | 12/2002 | Jain et al. |
| 6,498,640 B1 | 12/2002 | Ziger |
| 6,503,829 B2 | 1/2003 | Kim et al. |
| 6,514,672 B2 | 2/2003 | Young et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,521,536 B1 | 2/2003 | Robinson |
| 6,534,418 B1 | 3/2003 | Plat et al. |
| 6,541,360 B1 | 4/2003 | Plat et al. |
| 6,565,928 B2 | 5/2003 | Sakamoto et al. |
| 6,580,172 B2 | 6/2003 | Mancini et al. |
| 6,586,268 B1 | 7/2003 | Kopola et al. |
| 6,593,240 B1 | 7/2003 | Page |
| 6,621,960 B2 | 9/2003 | Wang et al. |
| 6,623,579 B1 | 9/2003 | Smith et al. |
| 6,627,544 B2 | 9/2003 | Izumi et al. |
| 6,629,292 B1 | 9/2003 | Corson et al. |
| 6,632,742 B2 | 10/2003 | Yang et al. |
| 6,635,581 B2 | 10/2003 | Wong |
| 6,646,662 B1 | 11/2003 | Nebashi et al. |
| 6,665,014 B1 | 12/2003 | Assadi et al. |
| 6,677,252 B2 | 1/2004 | Marsh |

| | | |
|---|---|---|
| 6,678,038 B2 | 1/2004 | Binnard |
| 6,696,220 B2 | 2/2004 | Bailey et al. |
| 6,713,238 B1 | 3/2004 | Chou et al. |
| 6,716,754 B2 | 4/2004 | Hofmann et al. |
| 6,719,915 B2 | 4/2004 | Willson et al. |
| 6,776,094 B1 | 8/2004 | Whitesides et al. |
| 6,805,054 B1 | 10/2004 | Meissl et al. |
| 6,809,356 B2 | 10/2004 | Chou |
| 6,828,244 B2 | 12/2004 | Chou |
| 6,833,325 B2 | 12/2004 | Huang et al. |
| 6,849,558 B2 | 2/2005 | Schaper |
| 6,870,301 B2 | 3/2005 | Choi et al. |
| 6,873,087 B1 * | 3/2005 | Choi et al. ............. 310/323.17 |
| 6,879,162 B2 | 4/2005 | Aguero et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,946,360 B2 | 9/2005 | Chou |
| 6,951,173 B1 | 10/2005 | Meissl et al. |
| 6,955,767 B2 | 10/2005 | Chen |
| 6,964,793 B2 | 11/2005 | Willson et al. |
| 7,071,088 B2 | 7/2006 | Watts et al. |
| 7,077,992 B2 | 7/2006 | Sreenivasan et al. |
| 7,105,452 B2 | 9/2006 | Sreenivasan |
| 7,117,583 B2 | 10/2006 | Dinan et al. |
| 7,128,875 B2 | 10/2006 | Cubicciotti |
| 7,214,624 B2 | 5/2007 | Fujita et al. |
| 7,244,386 B2 | 7/2007 | Sreenivasan et al. |
| 2001/0023829 A1 | 9/2001 | Olsson et al. |
| 2002/0038916 A1 | 4/2002 | Chiu et al. |
| 2002/0042027 A1 | 4/2002 | Chou et al. |
| 2002/0094496 A1 | 7/2002 | Choi et al. |
| 2002/0110992 A1 | 8/2002 | Ho |
| 2002/0111036 A1 | 8/2002 | Zhu et al. |
| 2002/0132482 A1 | 9/2002 | Chou |
| 2002/0150398 A1 | 10/2002 | Choi et al. |
| 2002/0167117 A1 | 11/2002 | Chou |
| 2002/0168578 A1 | 11/2002 | Wang et al. |
| 2002/0170880 A1 | 11/2002 | Chen |
| 2002/0177319 A1 | 11/2002 | Chou |
| 2002/0191141 A1 | 12/2002 | Liao |
| 2003/0017424 A1 * | 1/2003 | Park et al. .................... 430/322 |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0129542 A1 | 7/2003 | Shih et al. |
| 2003/0137494 A1 | 7/2003 | Tulbert |
| 2003/0151714 A1 | 8/2003 | Takahashi et al. |
| 2003/0174435 A1 | 9/2003 | Dinan et al. |
| 2003/0179354 A1 | 9/2003 | Araki et al. |
| 2003/0184917 A1 | 10/2003 | Chang et al. |
| 2003/0186140 A1 | 10/2003 | Fries |
| 2003/0197312 A1 | 10/2003 | Hougham et al. |
| 2003/0224116 A1 | 12/2003 | Chen et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0036201 A1 | 2/2004 | Chou et al. |
| 2004/0038552 A1 | 2/2004 | Watts et al. |
| 2004/0046288 A1 | 3/2004 | Chou |
| 2004/0065252 A1 | 4/2004 | Sreenivasan et al. |
| 2004/0065976 A1 | 4/2004 | Sreenivasan et al. |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0146792 A1 | 7/2004 | Nimmakayala et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0201890 A1 | 10/2004 | Crosby |
| 2004/0250945 A1 | 12/2004 | Zheng et al. |
| 2005/0006343 A1 | 1/2005 | Choi et al. |
| 2005/0037143 A1 | 2/2005 | Chou et al. |
| 2005/0056963 A1 | 3/2005 | McCutcheon |
| 2005/0189676 A1 | 9/2005 | Sreenivasan |
| 2005/0284886 A1 | 12/2005 | Penciu |
| 2006/0017876 A1 | 1/2006 | Watts |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |
| 2006/0113697 A1 | 6/2006 | Sreenivasan |
| 2006/0131785 A1 * | 6/2006 | Sewell ....................... 264/299 |
| 2006/0172031 A1 | 8/2006 | Babbs et al. |
| 2007/0126150 A1 | 6/2007 | GanapathiSubramanian et al. |
| 2007/0132152 A1 | 6/2007 | Choi et al. |
| 2007/0170617 A1 | 7/2007 | Choi et al. |

FOREIGN PATENT DOCUMENTS

| | | |
|---|---|---|
| EP | 0398589 | 4/1998 |
| FR | 2677043 A1 | 12/1992 |
| JP | 3-32888 | 2/1981 |
| JP | 58-129074 | 8/1983 |
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| WO | WO 87/02935 | 5/1987 |
| WO | WO 98/10121 | 3/1998 |
| WO | WO 99/05724 | 2/1999 |
| WO | WO 99/45753 | 9/1999 |
| WO | WO 00/21689 | 4/2000 |
| WO | 01/42858 A1 | 6/2001 |
| WO | WO 01/47003 | 6/2001 |
| WO | WO 01/63361 | 8/2001 |
| WO | WO 01/69317 | 9/2001 |
| WO | WO 01/79589 | 10/2001 |
| WO | WO 01/79933 | 10/2001 |
| WO | WO 02/22916 | 3/2002 |
| WO | WO 02/24977 | 3/2002 |
| WO | 03/099463 A2 | 12/2003 |
| WO | 2004016406 | 2/2004 |

OTHER PUBLICATIONS

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Wu, Large Area High Density Quantized Magnetic Disks Fabricated Using Nanoimprint Lithography, J. Vac. Sci. Technol. B 16(6), pp. 3825-3829 Nov. 1, 1998.

Gokan et al., Dry Etch Resistance of Organic Materials, J. Electrochem. Soc.: Solid-State Science and Technology, pp. 143-146 Jan. 1, 1983.

Chou, Nanoimprint Lithography and Lithographically Induced Self-Assembly, MRS Bulletin, pp. 512-517 Jul. 1, 2001.

Braeuer et al., Precise Polymer Micro-Optical Systems, MRS Bulletin, pp. 519-522 Jul. 1, 2001.

Choi et al., Design of Orientation Stages for Step and Flash Imprint Lithography, Precision Engineering, pp. 192-199 Jan. 1, 2001.

Ruchhoeft et al., Patterning Curved Surfaces: Template Generation by Ion Beam Proximity Lithography and Relief Transfer by Step and Flash Imprint Lithography, Journal of Vacuum Science and Technology, pp. 1-17 Jan. 1, 2000.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Xia et al., Soft Lithography, Annu Rev. Mater Sci. 1998 28: 153-184 Jan. 1, 1998.

Chou et al., Imprint of Sub-25 nm Vias and Trenches in Polymers, Appl. Phys. Lett. 67 (21) Nov. 20, 1995.

Otto et al., Characterization and Application of a Uv-based Imprint Technique, Microelectronic Engineering 57-58, pp. 361-366 Jan. 1, 2001.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Otto et al., Reproducibility and Homogeneity in Step and Repeat UV-Nanoimprint Lithography, Microelectronic Engineering 73-74, pp. 152-156 Jan. 1, 2004.

Kawata et al., Imprint/Photo Hybrid Litography Using Conventional Contact Aligner, Japanese Journal of Applied Physics, vol. 43, No. 6B, pp. 4027-4030 Jun. 29, 2004.

Kim et al., Reducing Photocurable Polymer Pattern Shrinkage and Roughness during Dry Etching in Photo-Nanoimprint Litography, Japanese Journal of Applied Physics, vol. 43, No. 6B, pp. 4022-4026 Jun. 29, 2004.

Abstract of Japanese Patent 58-129074, Aug. 1, 1983.

Chou et al., Ultrafast and Direct Imprint of Nanostructures in Silicon, Nature, Col. 417, (Jun. 2002), pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Wilson et al., Lithography and Etch Issues, Handbook of Multilevel Metallization for Integrated Circuits, pp. 566-567 Jan. 1, 1993.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

U.S. Appl. No. 10/951,014, naming Inventors Sreenivasan, entitled Method of Compensating for a Volumetric Shrinkage of a Material Disposed Upon a Substrate to Form a Substantially Planar Structure Therefrom, filed Sep. 27, 2004.

Schneider et al., Stripes of Partially Fluorinated Alkyl Chains: Dipolar Langmuir Monolayers, J. Chem. Phys. vol. 122, Issue 9 Mar. 1, 2005.

U.S. Appl. No. 11/126,946, naming Inventors Choi et al., entitled Formation of Discontinuous Films During an Imprint Lithography Process, filed May 11, 2005.

U.S. Appl. No. 11/127,041, naming Inventors Sreenivasan et al., entitled Step and Repeat Imprint Lithography Processes, filed May 11, 2005.

U.S. Appl. No. 11/127,060, naming Inventors Sreenivasan et al., entitled Step and Repeat Imprint Lithography Systems, filed May 11, 2005.

Mcmackin et al., Design and Performance of a Step and Repeat Imprinting Machine, SPIE Microltihgraphy Conference Feb. 1, 2003.

Le et al., Development of an Etch-Definable Lift-Off Process for Use with Step and Flash Imprint Lithography, SPIE Microlithography Conference Feb. 1, 2005.

Cardinale et al., Fabrication of a Surface Acoustic Wave-Based Correlator Using Step-and-Flash Imprint Lithography, J. Vac. Sci. Technol. B 22(6) Nov. 1, 2004.

U.S. Appl. No. 11/242,628, naming Inventors Meissl et al., entitled An Assembly and Method for Transferring Imprint Lithography Templates, filed Oct. 3, 2005.

U.S. Appl. No. 11/303,777, naming Inventors Ganapthisubramanian et al., entitled Bifurcated Contact Printing Technique, filed Dec. 16, 2005.

U.S. Appl. No. 11/292,394, naming Inventors Sreenivasan, entitled Eliminating Printability of Sub-Resolution Defects in Imprint Lithography, filed Nov. 30, 2005.

U.S. Appl. No. 11/314,957, naming Inventors Sreenivasan et al., entitled Step and Repeat Imprint Lithography Systems, filed Dec. 21, 2005.

Park et al., Aligning Liquid Crystals Using Replicated Nanopattems, PSI Scientific Report 2002, vol. VII, p. 85 Mar. 1, 2003.

Abstract of Japanese Patent 3-32888, Feb. 13, 1991.

Abstract of French Patent 2677043, Dec. 1, 1992.

Colburn et al., Dissertation for the Degree of Doctor of Philosophy, Step and Flash Imprint Lithography: A Low-Pressure, Room-Temperature Nanoimprint Lithography Aug. 1, 2001.

U.S. Appl. No. 11/692,450, naming Inventors Sreenivasan et al., entitled Patterning a Plurality of Fields on a Substrate to Compensate for Differing Evaporation Times, filed Mar. 28, 2007.

U.S. Appl. No. 11/695,850, naming Inventors Sreenivasan et al., entitled Method of concurrently patterning a substrate having a plurality of fields and a plurality of alignment marks, filed Apr. 3, 2007.

U.S. Appl. No. 11/693,236, naming Inventors Schmid et al., entitled Self-Aligned Process for Fabricating Imprint Templates Containing Variously Etched Features, filed Mar. 29, 2007.

U.S. Appl. No. 11/694,500, naming Inventors Sreenivasan et al., entitled Imprinting of Partial Fields at the Edge of the Wafer, filed Mar. 30, 2007.

Thurn et al., Stress Hysteresis and Mechanical Properties of Plasma-Enhanced Chemical Vapor Deposited Dielectric Films, Journal of Applied Physics, vol. 95, No. 3, pp. 967-976 Feb. 1, 2004.

Modreanu et al., Optical Properties of LPCVD Silicon Oxynitride, Thin Solid Films 337, pp. 82-84.

Casey et al., Control of Metal Deposition in a Web Coater, Controlling in both Transverse and Machine Direction, Proceedings, Annual Technical Conference—Society of Vacuum Coaters May 4, 1990.

Lu et al., The Effect of Deposition Parameters on Performance of VME-FPC, Proceedings of the IEEE International Vacuum Microelectronics Conference, IVMC Aug. 16, 2001.

Abstract of Japanese patent 02-192045, Jul. 27, 1990.

* cited by examiner

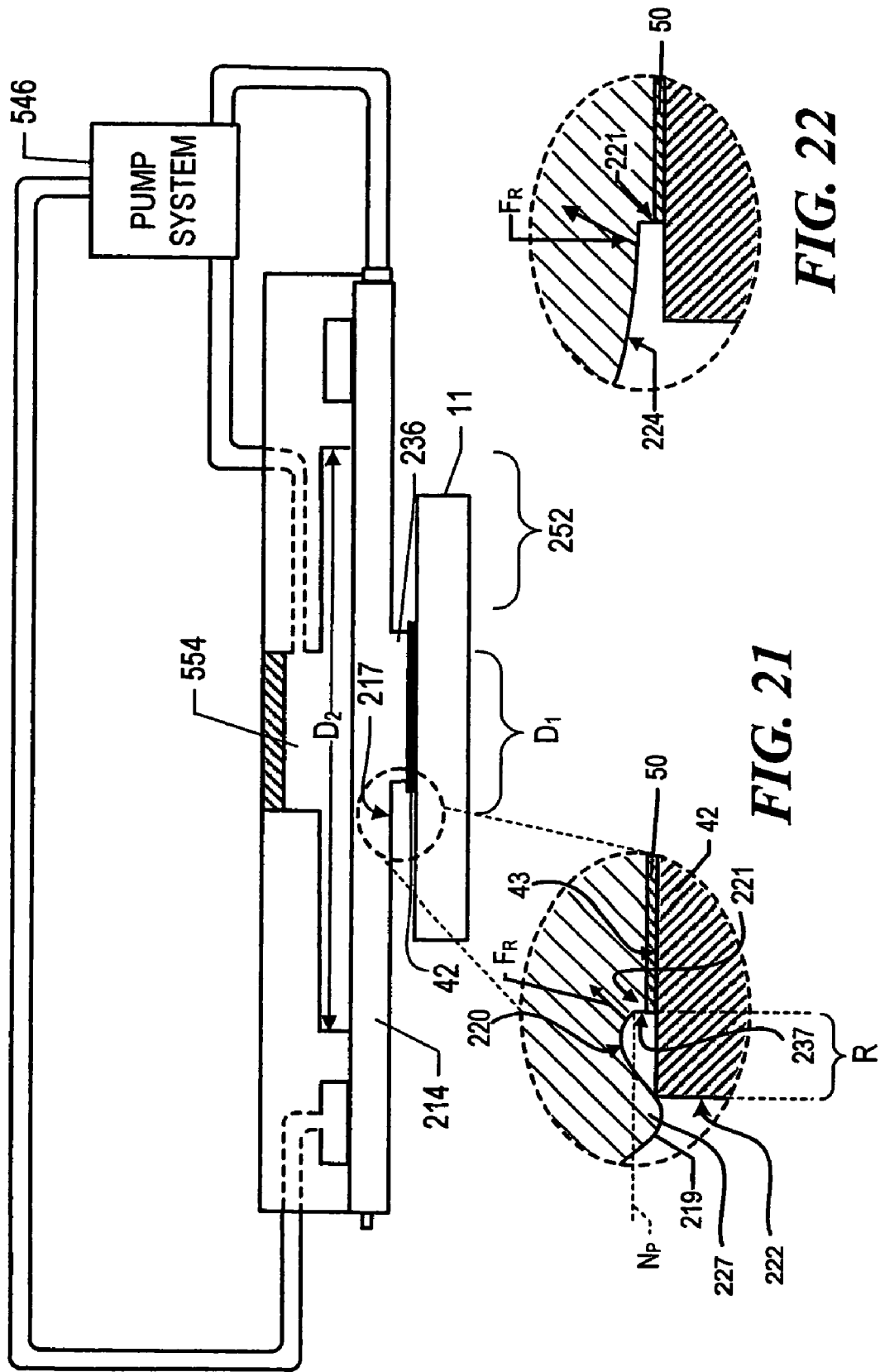

TECHNIQUE FOR SEPARATING A MOLD FROM SOLIDIFIED IMPRINTING MATERIAL

BACKGROUND OF THE INVENTION

The field of invention relates generally to nano-fabrication of structures. More particularly, the present invention is directed to a method for improving contact imprinting employed in imprint lithographic processes.

Nano-scale fabrication involves the fabrication of very small structures, e.g., having features on the order of one nanometer or more. A promising process for use in nano-scale fabrication is known as imprint lithography. Exemplary imprint lithography processes are described in detail in numerous publications, such as United States published patent application 2004/0065976 filed as U.S. patent application Ser. No. 10/264,960, entitled "Method and a Mold to Arrange Features on a Substrate to Replicate Features having Minimal Dimensional Variability"; U.S. published patent application 2004-0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Method and a Mold to Arrange Features on a Substrate to Replicate Features having Minimal Dimensions Variability"; all of which are assigned to the assignee of the present invention.

Referring to FIG. 1, the basic concept behind imprint lithography is forming a relief pattern on a substrate that may function as, inter alia, an etching mask so that a pattern may be formed into the substrate that corresponds to the relief pattern. A system 10 employed to form the relief pattern includes a stage 11 upon which a substrate 12 is supported, and a template 14 having a mold 16 with a patterning surface 18 thereon. Patterning surface 18 may be substantially smooth and/or planar, or may be patterned so that one or more recesses are formed therein. Template 14 is coupled to an imprint head 20 to facilitate movement of template 14. A fluid dispense system 22 is coupled to be selectively placed in fluid communication with substrate 12 so as to deposit polymerizable material 24 thereon. A source 26 of energy 28 is coupled to direct energy 28 along a path 30. Imprint head 20 and stage 11 are configured to arrange mold 16 and substrate 12, respectively, to be in superimposition, and disposed in path 30. Either imprint head 20, stage 11, or both vary a distance between mold 16 and substrate 12 to define a desired volume therebetween that is filled by polymerizable material 24. The relative positions of substrate 12 and stage 11 is maintained employing standard chucking techniques. For example, stage 11 may include a vacuum chuck, such as a pin chuck (not shown) coupled to a vacuum supply (not shown).

Typically, polymerizable material 24 is disposed upon substrate 12 before the desired volume is defined between mold 16 and substrate 12. However, polymerizable material 24 may fill the volume after the desired volume has been obtained. After the desired volume is filled with polymerizable material 24, source 26 produces energy 28, which causes polymerizable material 24 to solidify and/or cross-link, forming polymeric material conforming to the shape of the substrate surface 25 and mold surface 18. Control of this process is regulated by processor 32 that is in data communication with stage 11 imprint head 20, fluid dispense system 22, and source 26, operating on a computer-readable program stored in memory 34.

An important characteristic with accurately forming the pattern in polymerizable material 24 is to ensure that the dimensions of the features formed in the polymerizable material 24 are controlled. Otherwise, distortions in the features etched into the underlying substrate may result.

A need exists, therefore, to improve the imprinting technique employed in contact lithographic processes.

SUMMARY OF THE INVENTION

The present invention provides a method for separating a mold from solidified imprinting material that includes creating deformation in the template in which the mold is included. The deformation is sufficient to create a returning force that is greater than an adhesion forced between the solidified imprinting material and the mold. For example, the deformation may result from a pressure differential created between the mold and a side of the template disposed opposite to the mold. In this manner, the distortion may be undulations in the template of sufficient magnitude to contact a substrate upon which the solidified imprinting material is disposed. These and other embodiments are described herein.

BRIEF DESCRIPTION OF THE DRAWINGS

FIG. 21 is a simplified plan view of the chucking system shown in FIG. 17 with the template undergoing deformation to facilitate separation of the template from solidified imprinting material present on the substrate;

FIG. 22 is a detailed view of region 217, shown in FIG. 21, in accordance with an alternate embodiment;

DETAILED DESCRIPTION OF THE INVENTION

Figures 1, 2:
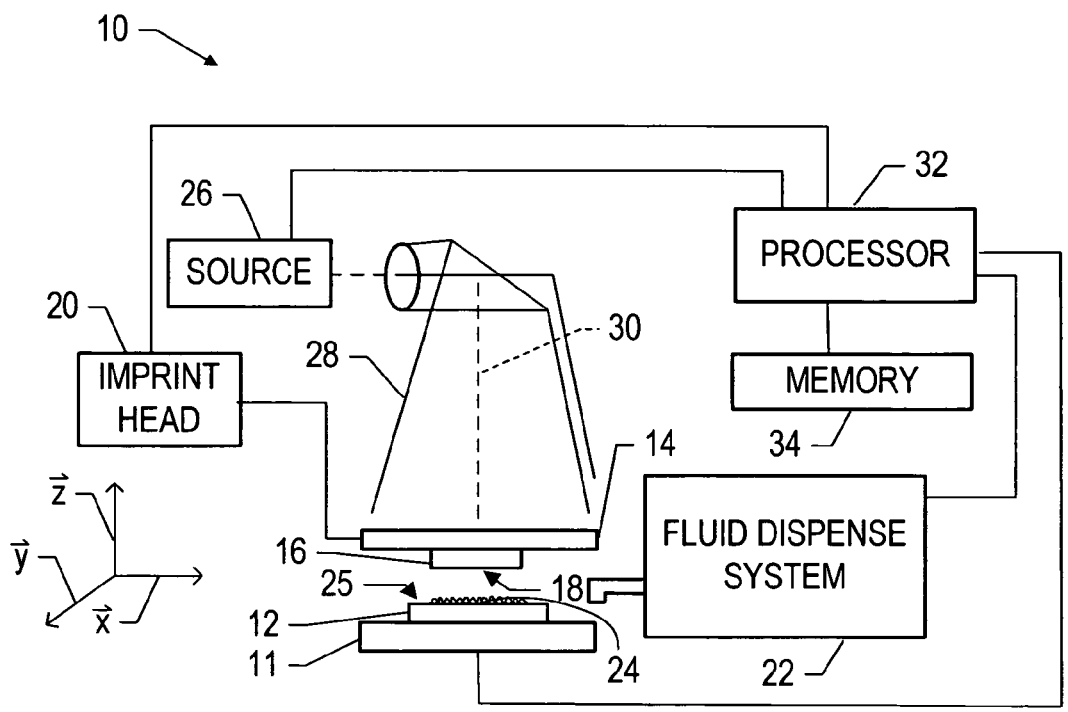
FIG. 1 is a simplified plan view of a lithographic system in accordance with the prior art.
FIG. 2 is a simplified plan view of a template and imprinting material disposed on a substrate in accordance with the present invention.

Referring to FIGS. 1 and 2, a mold 36, in accordance with the present invention, may be employed in system 10, and may define a surface having a substantially smooth or planar profile (not shown). Alternatively, mold 36 may include features defined by a plurality of spaced-apart recessions 38 and protrusions 40. The plurality of features defines an original pattern that is to be transferred into a substrate 42. Substrate 42 may be comprised of a bare wafer or a wafer with one or more layers disposed thereon. To that end, reduced is a distance "d" between mold 36 and substrate 42. In this manner, the features on mold 36 may be imprinted into an imprinting material, such as polymerizable material 24, disposed on a portion of surface 44 that presents a substantially planar profile. It should be understood that substrate 42 may be a bare silicon wafer 48 or may include a native oxide or one or more layers, shown as primer layer 45. In the present example, substrate 42 is discussed with respect to including a primer layer 45. Exemplary compositions from which primer layer 45 and polymerizable material 42 may be formed are discussed in U.S. patent application Ser. No. 11/187,406, filed Jul. 22, 2005, entitled COMPOSITION FOR ADHERING MATERIALS TOGETHER, having Frank Xu listed as the inventor, assigned to the assignee of the present invention and is incorporated by reference herein.

Figure 3:
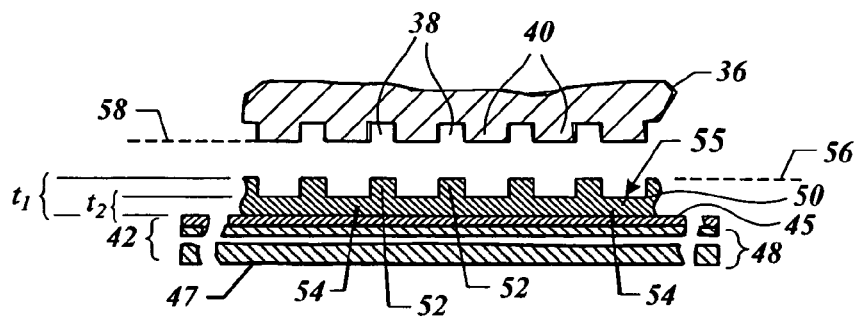
FIG. 3 is a simplified plan view of the template and substrate, shown in FIG. 2, with the imprinting material being shown as patterned and solidified upon the substrate.

Referring to both FIGS. 2 and 3, the imprinting material may be deposited using any known technique, e.g., spin-coating, dip coating and the like. In the present example, however, the imprinting material is deposited as a plurality of spaced-apart discrete droplets 46 on substrate 42. Imprinting material is formed from a composition that may be selectively polymerized and cross-linked to record the original pattern therein, defining a recorded pattern.

Specifically, the pattern recorded in the imprinting material is produced, in part, by interaction with mold 36, e.g., electrical interaction, magnetic interaction, thermal interaction, mechanical interaction or the like. In the present example, mold 36 comes into mechanical contact with the imprinting material, spreading droplets 46, so as to generate a contiguous layer of the imprinting material over surface 44 that is solidified into a formation 50. Formation 50 includes projections 52 and recessed regions 34. A height thickness $t_1$ of formation 50 is defined by projections 52. Recessed region 54 defines a residual thickness $t_2$ of formation 50. In one embodiment, distance "d" is reduced to allow imprinting material to ingress into and fill recessions 38. To facilitate filling of recessions 38, before contact between mold 36 and droplets 46, the atmosphere between mold 36 and droplets 46 is saturated with helium or is completely evacuated or is a partially evacuated atmosphere of helium.

Figure 4:
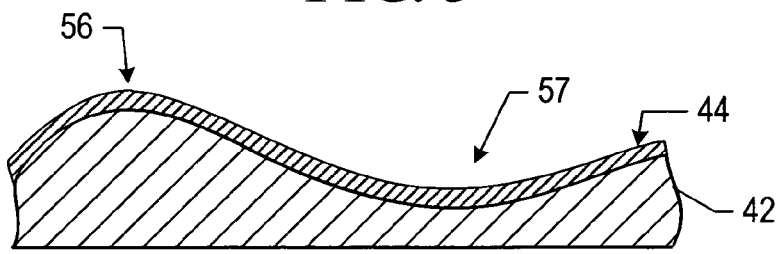
FIG. 4 is a detailed view of the substrate shown in FIGS. 2 and 3, in accordance with the present invention.

Referring to FIGS. 2, 3 and 4, a problem addressed by the present invention concerns controlling the thickness of $t_1$ and $t_2$ after reaching a desired distance d. Specifically, exemplary dimensions of the features of mold 36, e.g., width $W_1$ of protrusions 40 and width $W_2$ of recessions 38, may be in the range of 30 to 100 nanometers. Height with thickness $t_1$ may be in a range of 400 nanometers to one micrometer±20-80 nanometers. Residual thickness $t_2$ may be in a range of 400 nanometers to one micrometer±20-80 nanometers. Thus, a height of projections 52, measured from a nadir surface 55, is in a range 40 to 140 nanometers. As a result, surface 44 presents a non-planar profile, e.g., undulations are present as hills 56 and troughs 57. The undulations make problematic controlling thicknesses $t_1$ and $t_2$.

Figure 5:
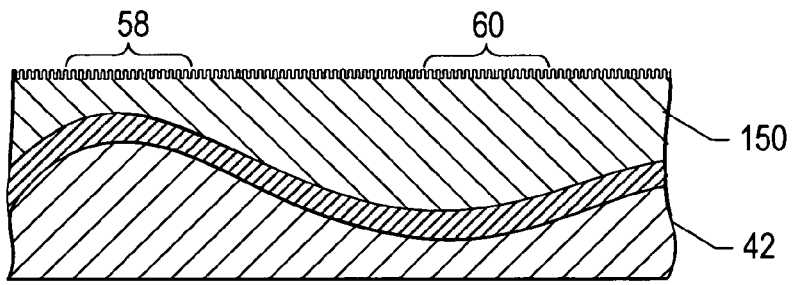
FIG. 5 is a detailed view of the substrate shown in FIG. 4 having a solidified formation of imprinting material disposed thereon.

Referring to FIGS. 3, 4 and 5, undulations make difficult ensuring that thickness $t_1$ is substantially equal over the area of formation 150 and thickness $t_2$ is substantially equal over the area of formation 150. For example, after solidifying imprinting material, formation 150 is formed in which regions over which thickness $t_1$ varies and thickness $t_2$ varies. For example, features in region 58 have a height thickness $t'_1 \pm \delta t'_1$ and a residual thickness $t'_2 \pm \delta t'_2$, where $\delta t'_1$ and $\delta t'_2$ results from the variation in thickness $t'_1$ and $t'_2$, respectively, due to the curvature of surface 44 in superimposition with region 58. Similarly, features in region 60 have a height thickness $t''_1 \pm \delta t''_1$ and a residual thickness $t''_2 \pm \delta t''_2$, where $\delta t''_1$ and $\delta t''_2$ correspond to the variation in thicknesses $t''_1$ and $t''_2$, respectively, due to the curvature of surface 44 in superimposition with region 60.

Figure 6:
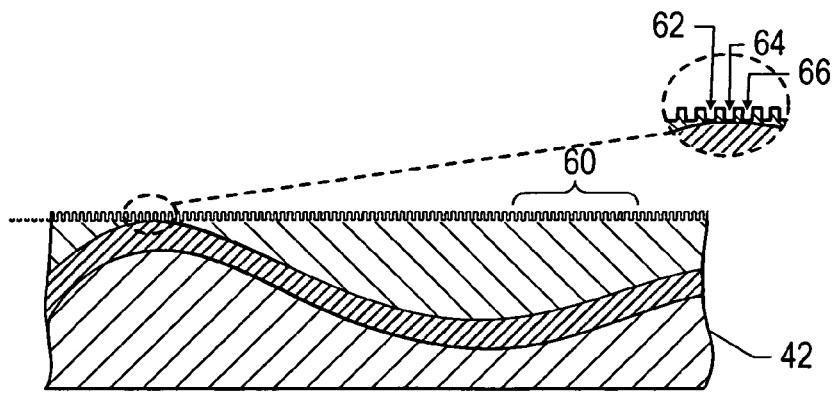
FIG. 6 is a detailed view of the substrate shown in FIG. 5 after being subjected to an etching chemistry to expose regions of the substrate.
Figure 7:
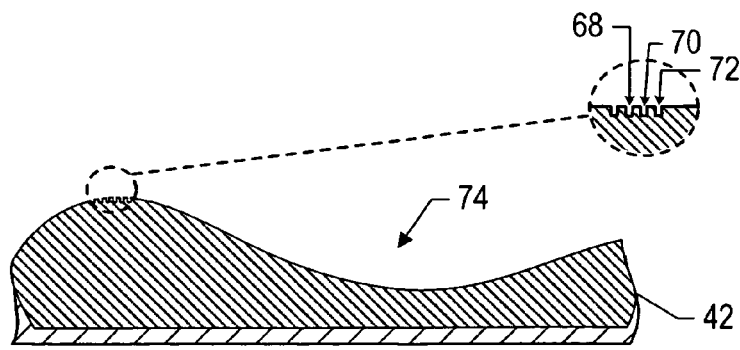
FIG. 7 is a detailed view of the substrate shown in FIG. 6 after being subjected to an etch and removal of the solidified imprinting material.

Referring to FIGS. 5, 6 and 7, were the difference between residual thicknesses $t'_2 \pm \delta t'_2$ and $t''_2 \pm \delta t''_2$ greater than $t'_1 \pm \delta t'_1$, a distortion in the pattern formed in substrate 42 would occur. This can be seen after formation 150 has undergone a break-through etch to expose regions 62 and 64 and 66 of substrate 42. Were it desired to commence etching of regions 62, 64 and 66, the result would be recesses 68, 70 and 72, with a largely unpatterned region 74 being present that results from no exposure of substrate 42 during the break-through etch. This is undesirable. Were it desired to pattern region 84 of substrate 42, etching of formation 150 would occur until a break-through in region 60 occurs. This would cause substantially all of the features of region 58 to be removed. As a result, large regions of substrate 42 would remain unpatterned, due, inter alia, to the absence of masking material.

Figure 8:
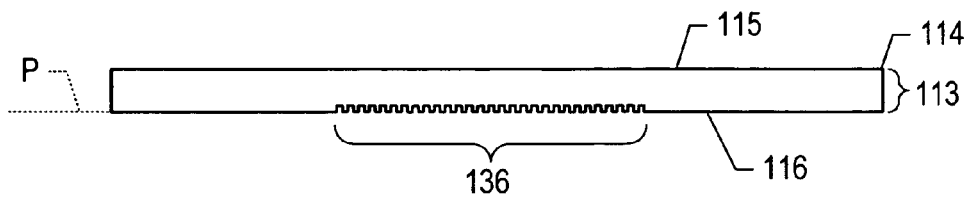
FIG. 8 is a cross-sectional view of a flexible template in accordance with the present invention.
Figure 9:
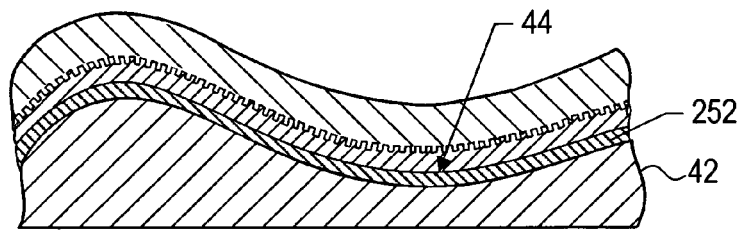
FIG. 9 is a cross-sectional view of the mold shown in FIG. 8 imprinting polymerizable material disposed on the substrate shown in FIG. 4, in accordance with the present invention.
Figure 10:
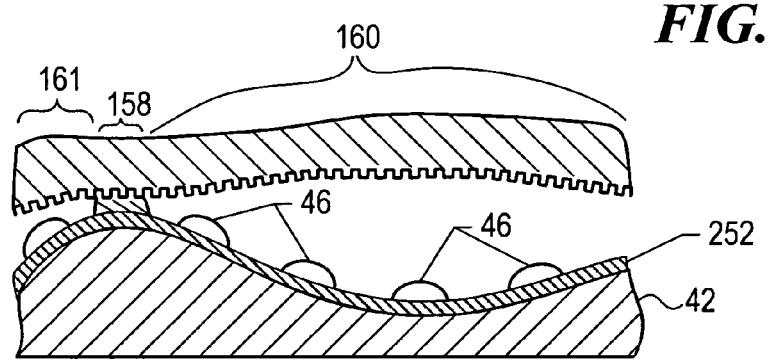
FIG. 10 is a detailed view of the mold shown in FIG. 9 before the same has conformed to a shape of the substrate.
Figure 11:
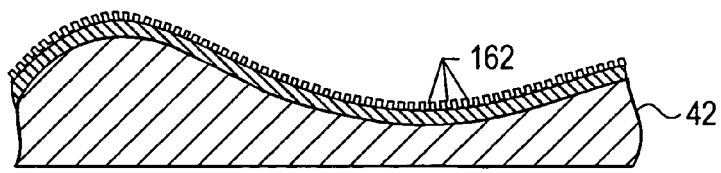
FIG. 11 is a detailed view of the substrate shown in FIG. 9 after being subjected to an etching chemistry to expose regions of the substrate.

Referring to FIGS. 3, 4 and 8, to reduce, if not abrogate, the problems presented by the undulations, template 114, including a mold 136, is made so as to conform to surface 44. In this manner, mold 136 may conform in response to the presence of undulations, thereby minimizing variations among thickness $t_1$ and variations among thickness $t_2$ over the area of formation 50. To that end, template 114 is fabricated from a relatively thin sheet of fused silica having a thickness 113, measured from opposed sides 115 and 116, up to approximately 1.5 millimeters, with of approximately 0.7 being preferred. With a thickness of 0.7 millimeter, flexibility is provided by establishing an area of template 114 to be approximately 4,225 square millimeters. The area of mold 136 may be any desired, e.g., from 625 square millimeters to be extensive with the area of substrate 42.

Referring to FIGS. 8-12 the conformableness of template 114 affords mold 136 the functionality so that control of thicknesses $t_1$ and $t_2$ may be achieved in the face of undulations. Specifically, mold 136 contacts imprinting material so that formation 250 may be formed. Formation 250 has a first surface 252 that rests against substrate 42 and has a profile matching the profile of the surface 44 of substrate 42 in the presence of undulations. However, a difficulty presented by flexible mold 236 results from the generation of capillary forces between mold 136 and the polymerizable material in droplets 46. Upon contact by mold 136 with a first subportion of the polymerizable material, e.g., droplets 46 in region 158, capillary forces between mold 136 and the polymerizable material are generated. However, capillary forces are substantially absent in the remaining sub-section of the polymerizable material, e.g., droplets in regions 160 and 161. To form formation 250, fluid pressure is applied to side 115 to deform template 114 and, therefore, mold 136 so that the same contacts droplets 46 in regions 160 and 161.

As a result of the flexibility of mold 136, control of thicknesses $t_1$ and $t_2$, is achieved so that thickness $t_1$ is within a specified tolerance±$\delta t_1$, referred to as being substantially uniform. Similarly thickness $t_2$ is substantially uniform in that the same is within a specified tolerance±$\delta t_2$. The tolerance results from the distortion in the features that result from the mold 136 conforming to surface 44. It was determined, however, that by maintaining $\delta t_1$ and $\delta t_2$ to be less than or equal to 5 nanometers over a 25 millimeter area that the distortions that result from the conformableness of mold 136 are acceptable. Specifically, after a break-through-etch of formation 250, regions 162 over the entire area of substrate 42 are exposed. Thereafter, patterning of the entire surface of substrate may occur, shown as recessions 164. In this manner, the entire substrate 42 may be patterned, thereby overcoming the problems associated with thickness $t_1$ having, as well as thickness $t_2$, varying, over an area of substrate 42 to be patterned.

Figure 13:
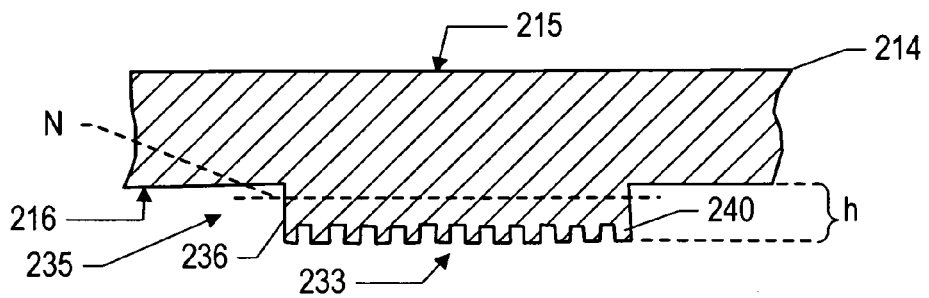
FIG. 13 is a cross-sectional view of the flexible template shown in FIG. 8, in accordance with an alternate embodiment of the present invention.

Referring to both FIGS. 8 and 13, although template 114 is shown having a mold 136 with protrusions lying in a common plane P along with surface 116, other templates may be employed. For example, template 214 may include a mesa 235 that embodies mold 236. Typically, a height, h, of mesa 235 is approximately 15 micrometers, as measured from surface 216 to a top surface of a protrusion 240.

Figure 14:
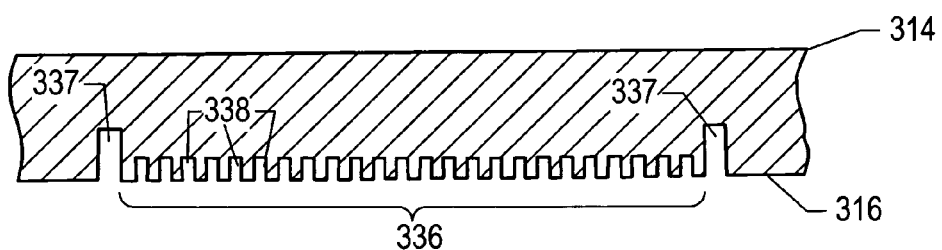
FIG. 14 is a cross-sectional view of the flexible template shown in FIG. 8, in accordance with a second alternate embodiment of the present invention.
Figure 15:
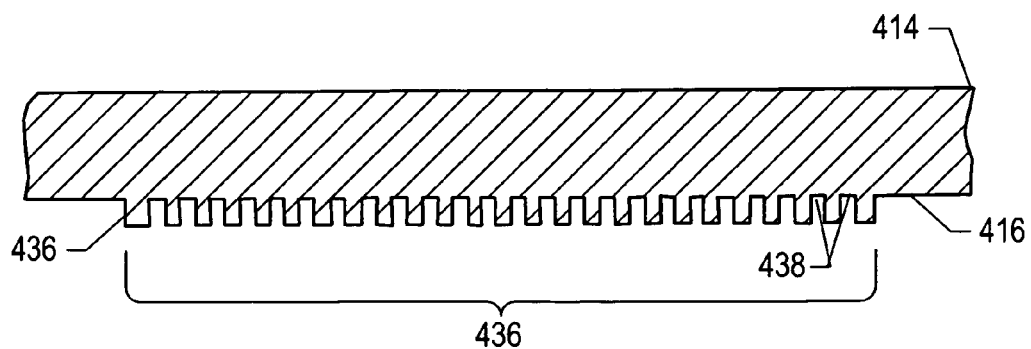
FIG. 15 is a cross-sectional view of the flexible template shown in FIG. 8, in accordance with a third alternate embodiment of the present invention.

Referring to both FIGS. 8 and 14, in another embodiment, template 314 is substantially identical to template 114, excepting that mold 336 is surrounded by an entrainment channel 337. Entrainment channel 337 extends further from side 316 than recessions 338. In yet another embodiment, template 414, shown in FIG. 15, is substantially identical to template 114, shown in FIG. 8, excepting that regions of side 416 lying outside of mold 436 are coplanar with recessions 438.

Figure 16:
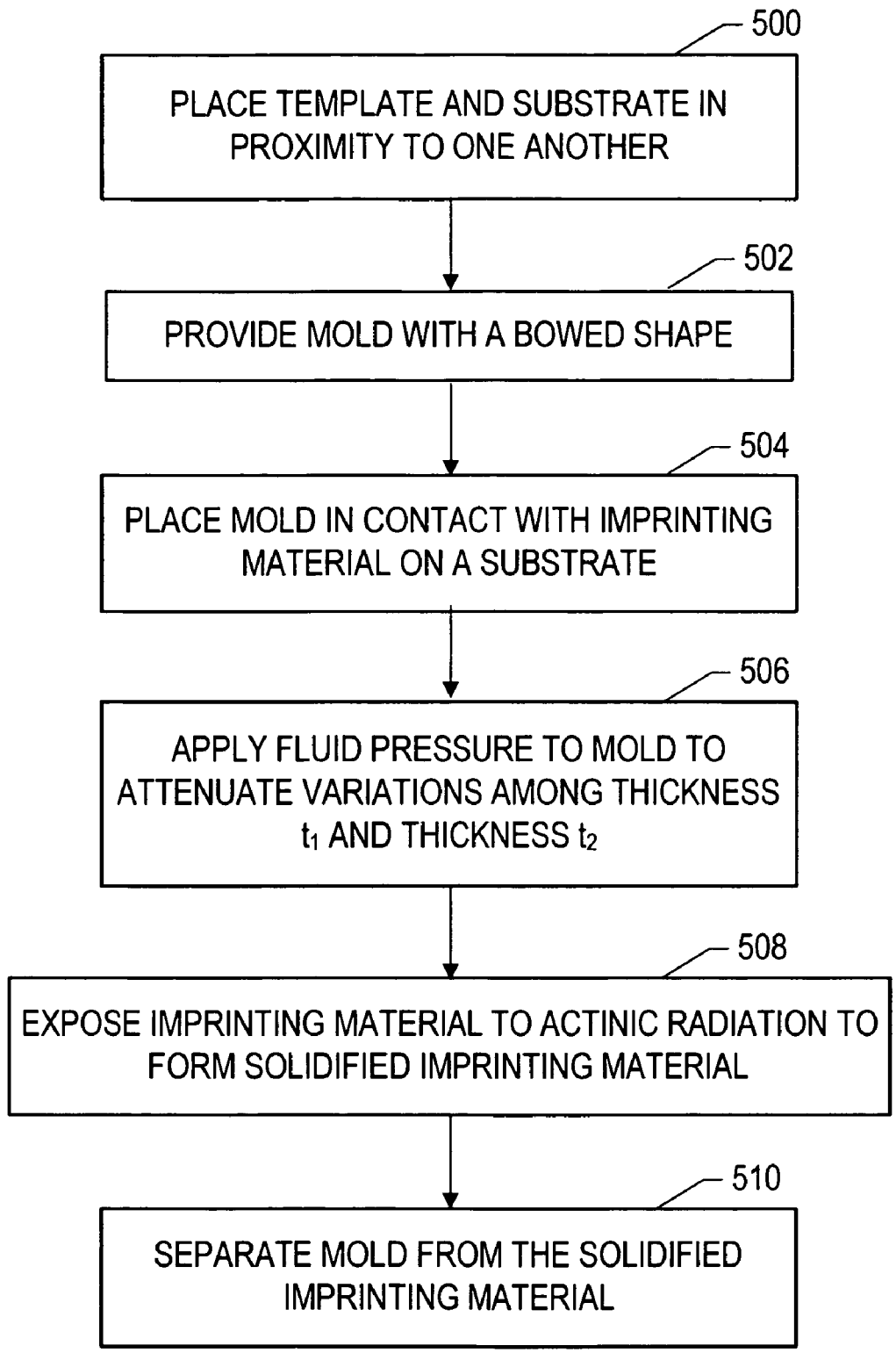
FIG. 16 is a flow diagram showing an exemplary imprinting operation employing the template shown in FIG. 12, in accordance with the present invention.

Referring to FIGS. 4, 13 and 16, during an exemplary operation, template 214 and substrate 42 are placed in proximity to one another, e.g., within one millimeter, at step 500. At step 502, template 214 is bowed so that side 216 facing substrate 42 and, therefore, mold 236, both have a convex shape, defining a bowed template. Specifically, a neutral axis, N, of mold 236 is bowed so that a central portion moves 350-400 micrometers away from neutral axis N so as to have a curved shape. At step 504, the relative distance between the bowed template and substrate 42 is reduced so that the bowed mold 236 is placed in contact with one or more of droplets 46 of imprinting material and subsequently conforms to the shape of the imprinting material disposed between mold 236 and substrate 42 under compression therebetween. Typically, mold 236 is centered with respect to substrate 42 before contacting the imprinting material. A central portion 233 of mold 236 is centered with respect to the area of substrate 42 that is to be patterned. In this example, nearly an entire surface 44 of substrate 44 is to be patterned. The dimension of the area of substrate 42 to be patterned is defined by the thicknesses of formation 250 and the aggregate volume of polymerizable material in droplets 46. As a result, the area of mold 236 may be greater, less than or equal to the area of substrate 42. Typically, central portion 233 of mold 236 contacts the center of the area (not shown) with the remaining portions of the imprinting area being subsequently contacted by the non-central portions of mold 236.

At step 506, fluid pressure is applied to side 115 to attenuate, if not abrogate, variations among thickness $t_1$ of the area of formation 150 and variations among thickness $t_2$ over the area of formation 150. Specifically, side 115 is subjected to a sufficient magnitude of fluid pressure to compress imprinting material between mold 236 and substrate 42 to the state whereby the imprinting material can no longer undergo compression. In this condition, the imprinting material demonstrates visco-elastic properties in that the same behaves as a solid. Further, in the visco-elastic state the imprinting material conforms fully with surface 44 so that a side of the imprinting material facing mold 236 has the same shape as surface 44. Mold 236 is established to be more compliant than the imprinting material in a visco-elastic state and, therefore, fully conforms to the shape of the side of the imprinting material facing mold 236. At step 508, imprinting material is exposed to actinic radiation to solidify the same so as to conform to a shape of the mold 236 and surface 44 of substrate 42. At step 510, mold 236 is separated from the solidified imprinting material.

Figure 12:
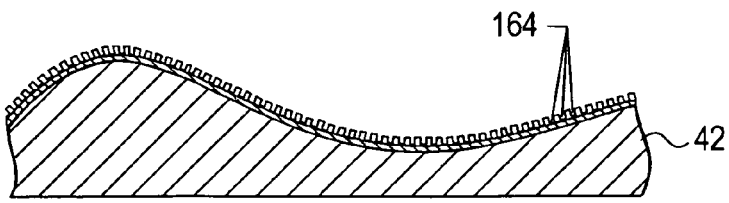
FIG. 12 is a detailed view of the substrate shown in FIG. 9 after being subjected to an etch and removal of the solidified imprinting material.
Figure 17:
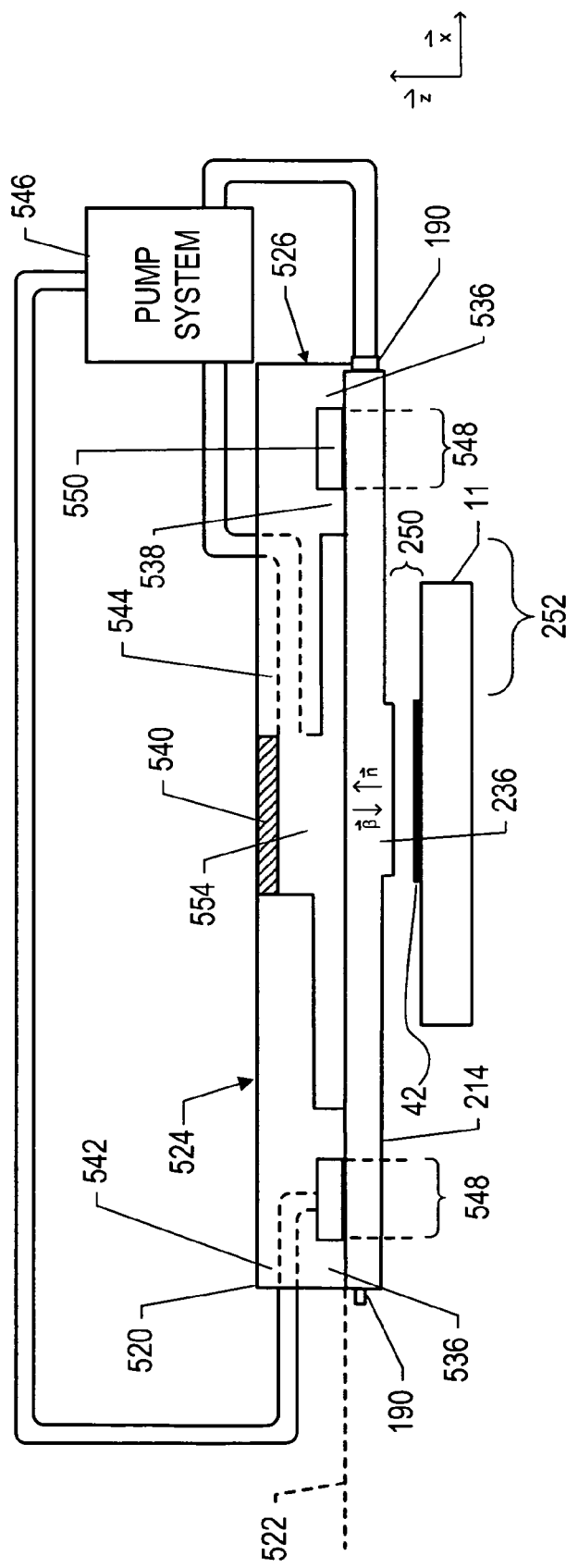
FIG. 17 is a simplified plan view of a chucking system employed to retain the template shown in FIG. 13, with the template being disposed proximate to a substrate.
Figure 18:
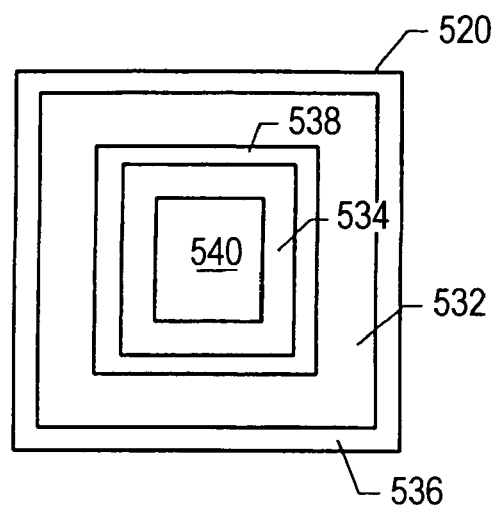
FIG. 18 is a bottom up view of a chuck body shown in FIG. 17.

Referring to FIGS. 12, 17 and 18, to facilitate control of the pressures on side 215 of template 214, disposed opposite to mold 236, a chuck body 520 is adapted to retain template 214 employing vacuum techniques. To that end, chuck body 520 includes first 522 and second 524 opposed sides. A side, or edge, surface 526 extends between first side 520 and second side 524. First side 522 includes a first recess 532 and a second recess 534, spaced-apart from first recess 532, defining first 536 and second 538 spaced-apart support regions. First support region 536 cinctures second support region 538 and the first 532 and second 534 recesses. Second support region 538 cinctures second recess 534. A portion 540 of chuck body 520 in superimposition with second recess 534 is transmissive to energy having a predetermined wavelength, such as the wavelength of actinic energy employed to solidify the polymerizable material mentioned above. To that end, portion 540 is made from a thin layer of material that is transmissive with respect to broad band ultraviolet energy, e.g., glass. However, the material from which portion 540 is made may depend upon the wavelength of energy produced by source 26, shown in FIG. 1.

Referring again to FIGS. 17 and 18, portion 540 extends from second side 524 and terminates proximate to second recess 534 and should define an area at least as large as an area of mold 236 so that mold 236 is in superimposition therewith. Formed in chuck body 520 are one or more throughways, shown as 542 and 544. One of the throughways, such as throughway 542, places first recess 532 in fluid communication with side surface 526. The remaining throughways, such as throughway 542, places second recess 532 in fluid communication with side surface 526.

It should be understood that throughway 542 may extend between second side 524 and first recess 532, as well. Similarly, throughway 544 may extend between second side 524 and second recess 534. What is desired is that throughways 542 and 544 facilitate placing recesses 532 and 534, respectively, in fluid communication with a pressure control system, such a pump system 546.

Pump system 546 may include one or more pumps to control the pressure proximate to recesses 532 and 534, independently of one another. Specifically, when mounted to chuck body 520, template 136 rests against first 536 and second 538 support regions, covering first 532 and second 534 recesses. First recess 532 and a portion 548 of template 136 in superimposition therewith define a first chamber 550. Second recess 534 and a portion 552 of template 136 in superimposition therewith define a second chamber 554. Pump system 546 operates to control a pressure in first 550 and second 554 chambers. Specifically, the pressure is established in first chamber 550 to maintain the position of the template 214 with the chuck body 520 and reduce, if not avoid, separation of template 214 from chuck body 520 under force of gravity $\bar{g}$. The pressure in second chamber 554 may differ from the pressure in first chamber 548 to reduce, inter alia, distortions in the pattern generated by template 214 during imprinting, by modulating a shape of template 214. For example, pump system 546 may apply a positive pressure in chamber 554 for the reasons discussed above. Pump system 546 is operated under control of processor 32, shown in FIG. 1.

Figure 19:
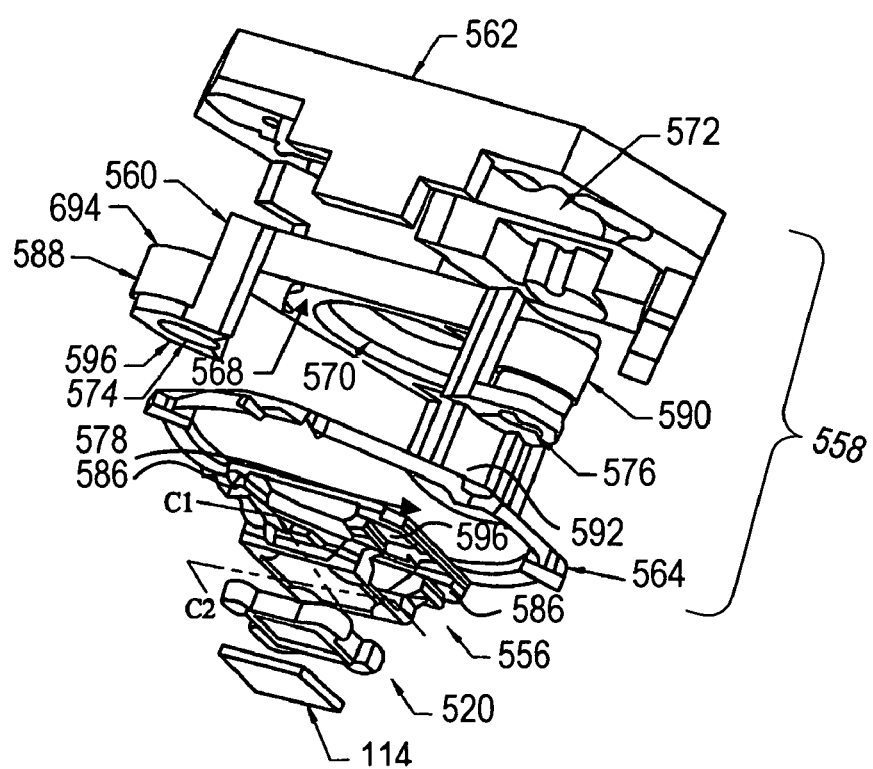
FIG. 19 is an exploded perspective view of components included in an imprint head, shown in FIG. 1 in accordance with the present invention.

Referring to FIGS. 1, 17 and 19, template 214 is coupled to imprint head 20 via coupling of chuck body 520 to a flexure 556 that is coupled to an orientation system 558. Orientation system 558 moves template 214. Flexure 556 is disclosed and claimed in U.S. patent application Ser. No. 11/142,838, filed Jun. 1, 2005, entitled "Compliant Device for Nano-Scale Manufacturing", which is assigned to the assignee of the present invention, and is incorporated by reference herein. Orientation system 558 is disclosed in U.S. patent application Ser. No. 11/142,825, filed Jun. 1, 2005 entitled "Method and System to Control Movement of a Body for Nano-Scale Manufacturing," which is assigned to the assignee of the present invention and incorporated by reference herein.

Referring to both FIGS. 19 and 20, orientation system 558 is shown having an inner frame 560 disposed proximate to an outer frame 562, and flexure ring 564, discussed more fully below. Body 520 is coupled to orientation system 558 through flexure 556. Specifically, body 520 is connected to flexure 556, using any suitable means, such as threaded fasteners (not shown) located at the four corners of body 520 connecting to four corners of flexure 556 closest to the four corners of body 520. Four corners 566 of flexure 556 that are closest to a surface 568 of inner frame 560 are connected thereto using any suitable means, such as threaded fasteners, not shown.

Inner frame 560 has a central throughway 570, and outer frame 562 has a central opening 572 in superimposition with central throughway 570. Flexure ring 564 has an annular shape, e.g., circular or elliptical, and is coupled to inner frame 560 and outer frame 562 and lies outside of both central throughway 570 and central opening 572. Specifically, flexure ring 564 is coupled to inner frame 560 at regions 574, 576 and 578, and outer frame 562 at regions 580, 582 and 584 using any suitable means, such as threaded fasteners (not shown). Region 580 is disposed between regions 574 and 576 and disposed equidistant therefrom; region 582 is disposed between regions 576 and 58 and disposed equidistant therefrom; and region 584 is disposed between regions 574 and 58 and disposed equidistant therefrom. In this manner, flexure ring 564 surrounds flexure 556, body 520, and template 214 and fixedly attaches inner frame 560 to outer frame 562.

It should be understood that the components of orientation system 558 and flexure 556 may be formed from any suitable material, e.g., aluminum, stainless steel and the like. Additionally, flexure 556 may be coupled to orientation system 558 using any suitable means. In the present example, flexure 556 is coupled to surface 45 employing threaded fasteners (not shown) located at the four corners 586.

Referring to FIGS. 17 and 19, system 558 is configured to control movement of template 214 and to place the same in a desired spatial relationship with respect to a reference surface, such as substrate 42 disposed on stage 11. To that end, a plurality of actuators 588, 590 and 592 are connected between outer frame 562 and inner frame 560 so as to be spaced about orientation system 558. Each of actuators 588, 590 and 592 has a first end 594 and a second end 596. First end 594 faces outer frame 562, and second end 596 faces away from outer frame 562.

Figure 20:
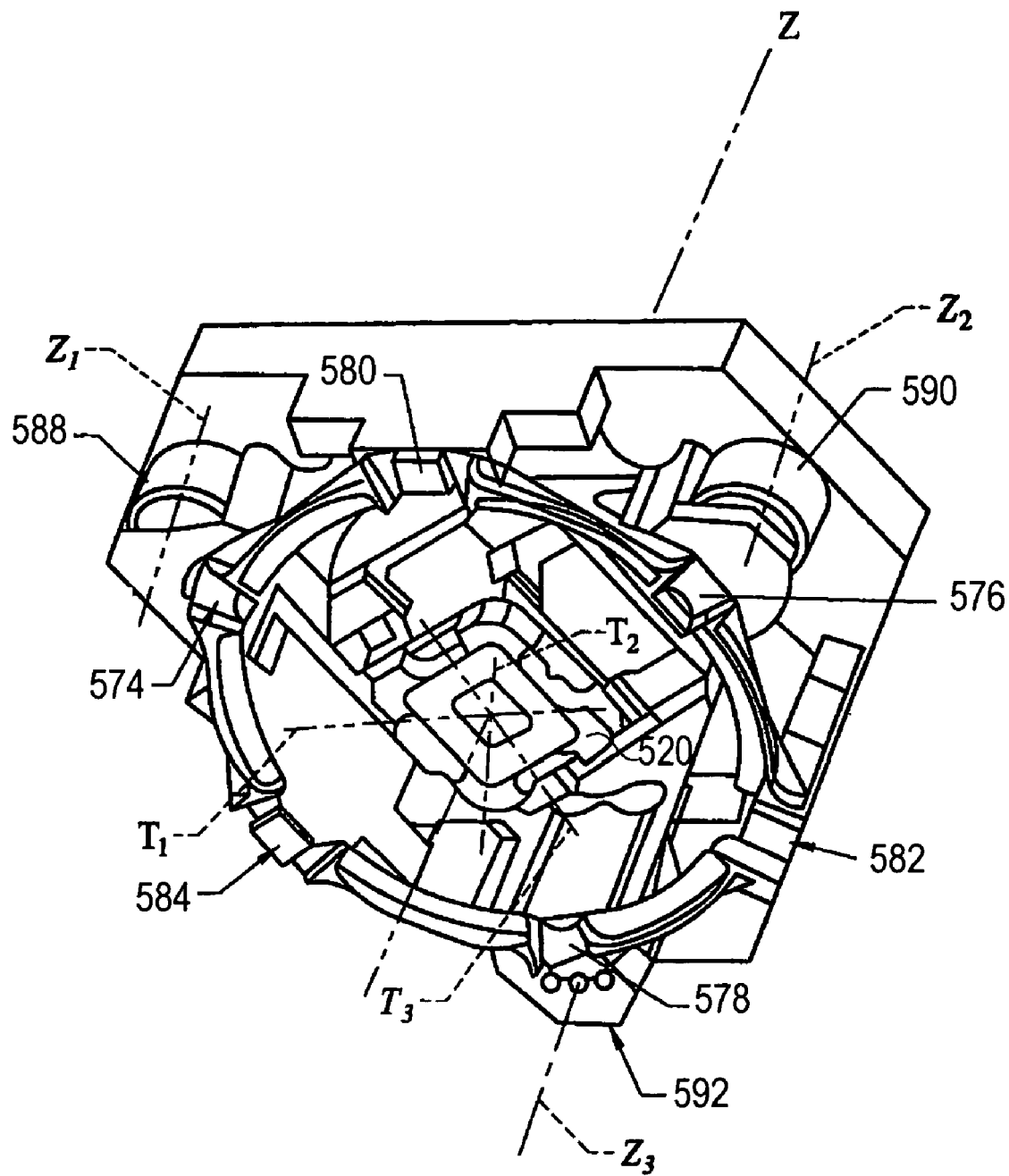
FIG. 20 is a bottom perspective view of the components shown in FIG. 19.
Figure 23:
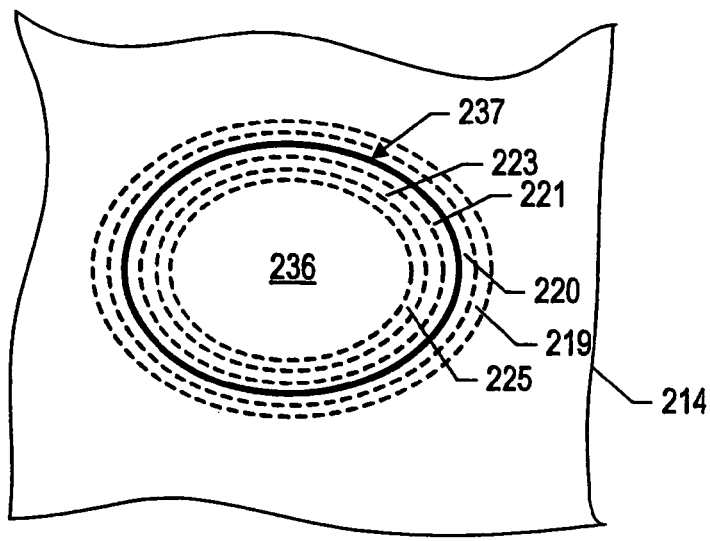
FIG. 23 is a simple plan view of template 214 shown in FIG. 21.

Referring to both FIGS. 19 and 20, actuators 588, 590 and 592 tilt inner frame 560 with respect to outer frame 562 by facilitating translational motion of inner frame 560 along three axes $Z_1$, $Z_2$, and $Z_3$. Orientation system 558 may provide a range of motion of approximately ±1.2 mm about axes $Z_1$, $Z_2$, and $Z_3$. In this fashion, actuators 588, 590 and 592 cause inner frame 560 to impart angular motion to both flexure 556 and, therefore, template 214 and body 520, about one or more of a plurality of axes $T_1$, $T_2$ and $T_3$. Specifically, by decreasing a distance between inner frame 560 and outer frame 562 along axes $Z_2$ and $Z_3$ and increasing a distance therebetween along axis $Z_1$, angular motion about tilt axis $T_2$ occurs in a first direction.

Increasing the distance between inner frame 560 and outer frame 562 along axes $Z_2$ and $Z_3$ and decreasing the distance therebetween along axis $Z_1$, angular motion about tilt axis $T_2$ occurs in a second direction opposite to the first direction. In a similar manner angular movement about axis $T_1$ may occur by varying the distance between inner frame 560 and outer frame 562 by movement of inner frame 560 along axes $Z_1$ and $Z_2$ in the same direction and magnitude while moving of the inner frame 560 along axis $Z_3$ in a direction opposite and twice to the movement along axes $Z_1$ and $Z_2$. Similarly, angular movement about axis $T_3$ may occur by varying the distance between inner frame 560 and outer frame 562 by movement of inner frame 560 along axes $Z_1$ and $Z_3$ in the same direction and magnitude while moving of inner frame 560 along axis $Z_2$ in direction opposite and twice to the movement along axes $Z_1$ and $Z_3$. Actuators 588, 590 and 592 may have a maximum operational force of ±200 N. Orientation System 558 may provide a range of motion of approximately ±0.15° about axes $T_1$, $T_2$, and $T_3$.

Actuators 588, 590 and 592 are selected to minimize mechanical parts and, therefore, minimize uneven mechanical compliance, as well as friction, which may cause particulates. Examples of actuators 588, 590 and 592 include voice coil actuators, piezo actuators, and linear actuators. An exemplary embodiment for actuators 588, 590 and 592 is available from BEI Technologies of Sylmar, Calif. under the trade name LA24-20-000A and are coupled to inner frame 560 using any suitable means, e.g., threaded fasteners. Additionally, actuators 588, 590 and 592 are coupled between inner frame 560 and outer frame 562 so as to be symmetrically disposed thereabout and lie outside of central throughway 570 and central opening 572. With this configuration an unobstructed throughway between outer frame 562 to flexure 556 is configured. Additionally, the symmetrical arrangement minimizes dynamic vibration and uneven thermal drift, thereby providing fine-motion correction of inner frame 560.

The combination of the inner frame 560, outer frame 562, flexure ring 564 and actuators 588, 590 and 592 provides angular motion of flexure 556 and, therefore, body 520 and template 214 about tilt axes $T_1$, $T_2$ and $T_3$. It is desired, however, that translational motion be imparted to template 214 along axes that lie in a plane extending transversely, if not orthogonally, to axes $Z_1$, $Z_2$, and $Z_3$. This is achieved by providing flexure 556 with the functionality to impart angular motion upon template 214 about one or more of a plurality of compliance axes, shown as C1 and C2, which are spaced-part from tilt axes $T_1$, $T_2$ and $T_3$ and exist on the surface of the template when the template, the template chuck, and the compliant device are assembled.

Another embodiment of the present invention facilitates separation of mold 236 from the solidified imprinting material which forms, for example, formation 50. This is based upon the finding that localizing initial separation to a relatively small area of the interface between mold 236 and the solidified imprinting material reduces the magnitude of upwardly forces imparted upon mold 236 by orientation system 558 necessary to achieve separation. A desirable result is that the probability of separation between substrate 42 and stage 11 is reduced.

Referring to FIG. 21, a deleterious situation that the present invention seeks to avoid separation of substrate 42 from stage 11 upon separation of mold 236 from formation 50. Imprint head 20 applies a sufficient force to overcome the forces of attraction between mold 236 and formation 50. In the situation in which the area of mold 236 is substantially co-extensive with the area of substrate 42, e.g., whole wafer imprinting, the force required to separate mold 236 from formation 50 is often much greater than the force of attraction between substrate 42 and stage 11, e.g., a vacuum or electrostatic force of attraction between substrate 42 and stage 11. Therefore, it is desirable to reduce the force applied to template 214 necessary to achieve separation of mold 236 from formation 50. Specifically, it is desirable to ensure that the upwardly force required to separate template 114 from formation 50 is less than the downwardly applied by stage 11 to substrate 42 to maintain the same thereupon.

The upwardly force required to separate template 214 from formation 50 is reduced by creating localized separation between mold 236 and formation 50 at a region proximate to a periphery of mold 236. To that end, for mold 236 having an area substantially coextensive with substrate 42, mold 236 will have a maximum area to ensure that a perimeter 237 thereof is spaced-apart from an edge 222 of substrate 42 approximately 1 millimeter, shown as distance R. Localized separation is obtained by initiating separation of mold 236 from the solidified imprinting material employing pump system 546 pressurizing chamber 554 to approximately 20 kPa. This distorts the shape of a region 217 of template 214 that surrounds mold 236. A first portion 219 of the surface template 214 in region 217 is displaced downwardly away from a neutral position $N_P$ toward substrate 42, with the nadir of portion 219 being approximately 1 micrometer below surface 43 of substrate 42. As a result, the distortion afforded to template 214 by pump system 546 should be sufficient to allow nadir portion 219 to extend from the neutral position $N_P$ a magnitude that is greater than the thickness $t_1$, shown in FIG. 3, and height h, shown in FIG. 13.

Referring again to FIGS. 21 and 22, a second portion 220 of the surface of template 214 moves upwardly away from substrate 42, with an apex thereof being spaced-apart from surface 43 approximately fifteen micrometers. A segment of template disposed between second portion 220 and nadir portion 219 contacts edge 222 of substrate 42. The Young's modulus associated with template 214 results in a returning force $F_R$ to facilitate returning region 217 to neutral position $N_P$, wherein undulations shown as nadir portion 219 and second portion are attenuated to form arcuate surface 224. The returning force $F_R$ results from the material of template 214 undergoing movement to return to a reduced-stressed and/or reduced-strained state.

Figure 24:
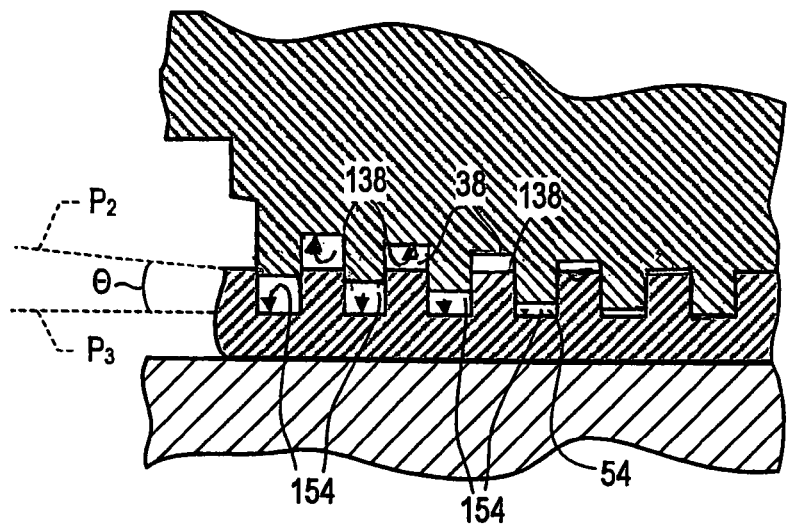
FIG. 24 is a detailed cross-section view showing the template of FIG. 21 undergoing separation from formation 50.
Figure 25:
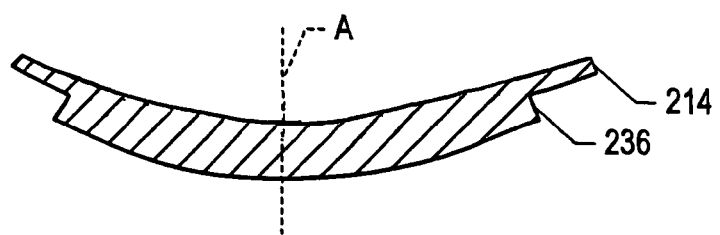
FIG. 25 is a simplified cross-sectional view of the template shown in FIG. 21.

Referring to both FIGS. 21, 24 and 25, the returning force $F_R$ causes an area 221 of mold 236 proximate to region 217 to separate from substrate 42, while segment 227 functions to press substrate 42 downwardly against stage 11, firmly securing the same together. In this manner, separation mold 236 from formation 50 occurs by cantilevering template 214 with respect to substrate 42. Specifically, portion 227 contacts edge 222 of substrate 42 holding the same against stage 11, which reduces the upwardly force on template 214 required to separate mold 236 from substrate and prevents substrate 42 from separating from stage 11. It can be said, therefore, that returning force $F_R$ reduces the magnitude of the upwardly forces imparted upon mold 236 by orientation system 558 that are necessary to achieve separation. As a result, returning force $F_R$ must be greater than the adhering force between area 221 and formation 50. The returning force $F_R$ results in an oblique angle θ being formed with respect to formation 50, measured for example, between a plane $P_2$ in which nadir surfaces 138 of recessions 38 lie and a plane $P_3$ in which nadir surfaces 154 of recessed regions 54 lie. The back pressure and returning force $F_R$ coupled with the angle θ, causes template 214 and, therefore, mold 236, to have an arcuate shape in which region 221 is further from formation 50 than regions of mold 236 disposed remotely therefrom, center portions of mold 236 located proximate to center axis A. Typically, the angle θ will be on the order of micro-radians so that shearing of features in solidified layer 50 is on the order of pico-meters. The remaining portions of mold 236 are separated from formation 50 may be controlled by operation of actuators 588, 590 and 592, shown in FIG. 19.

Referring to both FIGS. 19 and 25, by having actuators 588, 590 and 592 move at approximately the same rate, mold 236 is separated from formation so that the last portions thereof proximate to region 221 are separated from formation 50 before regions proximate to center axis A. In this manner, regions of mold 236 that are radially symmetrically disposed about axis A are sequentially separated from formation 50, e.g., region 221 separates then region 223, then region 225 and etc. It should be understood, however, that regions 221, 223 and 225 are radially symmetrically disposed about axis A, due to the shape of mold 236. It is entirely possible that mold 236 have a rectangular or square shape. As a result, the shape of regions sequentially removed from formation 50 would be complementary to the shape of perimeter 237. As a result, regions of mold 236 that are concentric with respect to perimeter 237 are sequentially separated from formation 50. It should be understood, however, that actuators 588, 590 and 592 may be operated so as to produce a peeling separation of mold 236 from formation 50. This may be achieved by moving mold 236 about on of tilt axes $T_1$, $T_2$ and $T_3$.

Referring to FIGS. 21 and 22, another manner to achieve localized separation of template 214 would include forming arcuate surface 224 of template that is proximate to mold 236. Specifically, pump system 546 would create a pressure in pressurizing chamber 554 sufficient to bow arcuate surface 224 and provide the same with a substantially constant radius of curvature. The returning force $F_R$ would induce localized separation between mold 236 and formation 50 proximate to region 221, as discussed above. Thereafter, mold 236 may be separated from formation 50 employing the techniques discussed above. Forming contoured surface is particularly advantageous were mold 236 sized so as to be much smaller than the area of substrate 42, e.g., were mold 236 to have an area of 625 square millimeters, cantilevering would not occur.

The embodiments of the present invention described above are exemplary. Many changes and modifications may be made to the disclosure recited above, while remaining within the scope of the invention. The scope of the invention should not, therefore, be limited by the above description, but instead should be determined with reference to the appended claims along with their full scope of equivalents.

What is claimed is:

1. A method for separating a mold, included in a template, from solidified imprinting material disposed on a substrate, said template including a first side disposed opposite to said mold, said method comprising:

pressurizing a chamber positioned adjacent to said first side of said template such that pressure is applied directly to said first side of said template to deform said template proximate to said mold, wherein deformation of said template is at a region of said template that surrounds said mold and deformation of said template from applied pressure being sufficient to create a returning force that is greater than an adhesion force between said solidified imprinting material and said mold.

2. The method as recited in claim 1 wherein applying pressure directly to said first side of said template provides a pressure differential between said first side and said mold.

3. The method as recited in claim 1 wherein applying pressure directly to said first side of said template further includes generating an undulation in said mold of sufficient magnitude to contact at least one edge of substrate.

4. The method as recited in claim 1 wherein said mold includes a perimeter and further including separating regions of said mold, from said solidified imprinting material, disposed concentrically with respect to said perimeter.

5. The method as recited in claim 1 wherein said mold includes a perimeter and further including sequentially separating a plurality of regions of said mold, from said solidified imprinting material, disposed concentrically with respect to said perimeter.

6. The method as recited in claim 1 further including separating regions of said mold, from said solidified imprinting material, that are radially symmetrically disposed about an axis passing through a center of said mold.

7. The method as recited in claim 1 further including sequentially separating a plurality of regions of said mold, from said solidified imprinting material, that are radially symmetrically disposed about an axis passing through a center of said mold.

8. The method as recited in claim 1 further including separating regions of said mold, from said solidified imprinting material, by rotating said mold about an axis that extends transversely to a normal of a surface of said mold.

9. The method as recited in claim 1 wherein deformation of said template from applied pressure includes forming a surface of said template surrounding mold to have a constant radius of curvature.

10. A method for separating a mold, included in a template, from solidified imprinting material disposed on a substrate, said template including a first side disposed opposite to said mold, said method comprising:

pressurizing a chamber positioned adjacent to said first side of said template such that pressure is applied directly to said first side of said template to create a deformation in said template proximate to said mold, wherein deformation of said template is at a region of said template that surrounds said mold, applied pressure sufficient to create a returning force that is greater than an adhesion force between said solidified imprinting material and said mold; and separating regions of said mold from said formation that are spaced-apart from a perimeter of said mold.

11. The method as recited in claim 10 wherein applying pressure directly to said first side of said template to create a deformation in said template includes creating a pressure differential between said first side and said mold.

12. The method as recited in claim 10 wherein applying pressure directly to said first side of said template to create a deformation in said template further includes generating an undulation in said mold of sufficient magnitude to contact said substrate.

13. The method as recited in claim 10 wherein separating regions of said mold from said formation further includes sequentially separating a plurality of regions of said mold disposed concentrically with respect to said perimeter.

14. The method as recited in claim 10 wherein separating regions of said mold from said formation further includes sequentially separating a plurality of regions of said mold that are radially symmetrically disposed about an axis passing through a center of said mold.

15. The method as recited in claim 10 further including separating regions of said mold by rotating said mold about an axis that extends transversely to a normal of a surface of said mold.

16. The method as recited in claim 10 wherein generating further includes forming a surface of said template surrounding mold to have a constant radius of curvature.

17. A method for separating a mold, included in a template, from solidified imprinting material disposed on a substrate, said template including a first side disposed opposite to said mold, said method comprising:

separating said mold from said solidified imprinting material by pressurizing a chamber positioned adjacent to said first side of said template such that pressure is applied directly to said first side of said template to create undulations—in a region of said template that surrounds said mold and creating a space between said mold and said solidified imprinting material.

18. The method as recited in claim 17 wherein separating said mold from said solidified imprinting material further includes creating a pressure differential between said first side and said mold.

19. The method as recited in claim 17 wherein separating said mold from said solidified imprinting material further includes generating said undulation in said template to have a sufficient magnitude to contact at least one edge of substrate.

20. The method of claim 1, wherein said template is an imprint lithography template.

21. The method of claim 10, wherein said template is an imprint lithography template.

22. The method of claim 17, wherein said template is an imprint lithography template.

* * * * *